(12) United States Patent
Al-Shahrani

(10) Patent No.: US 7,893,745 B2
(45) Date of Patent: Feb. 22, 2011

(54) WIDEBAND PROGRAMMABLE PHASE SHIFTING CIRCUIT

(75) Inventor: Saad Mohammad Al-Shahrani, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 66 days.

(21) Appl. No.: 12/458,029

(22) Filed: Jun. 29, 2009

(65) Prior Publication Data
US 2010/0327931 A1    Dec. 30, 2010

(51) Int. Cl.
*H03H 11/16* (2006.01)
(52) U.S. Cl. .......... 327/231; 327/237; 327/246
(58) Field of Classification Search .......... None
See application file for complete search history.

(56) References Cited

U.S. PATENT DOCUMENTS

| | | | |
|---|---|---|---|
| 4,985,905 A | | 1/1991 | Kubinec |
| 5,399,995 A | | 3/1995 | Kardontchik et al. |
| 5,589,793 A | * | 12/1996 | Kassapian .......... 327/536 |
| RE35,829 E | | 6/1998 | Sanderford, Jr. et al. |
| RE37,452 E | | 11/2001 | Donnelly et al. |
| 6,313,707 B1 | | 11/2001 | Fischer et al. |
| 6,317,006 B1 | | 11/2001 | Welland et al. |
| 6,535,071 B2 | | 3/2003 | Forbes |
| 6,901,126 B1 | | 5/2005 | Gu |
| 7,109,765 B1 | | 9/2006 | Wang et al. |
| 2001/0024139 A1 | * | 9/2001 | Yasue .......... 327/536 |
| 2008/0122491 A1 | * | 5/2008 | Kuan .......... 327/43 |
| 2009/0015340 A1 | | 1/2009 | Dally et al. |

FOREIGN PATENT DOCUMENTS

| WO | WO2007073150 A1 | 6/2007 |
|---|---|---|
| WO | WO2008018769 A1 | 2/2008 |

* cited by examiner

*Primary Examiner*—Tuan Lam
(74) *Attorney, Agent, or Firm*—Richard C. Litman

(57) ABSTRACT

The wideband programmable phase shifting circuitry includes a charge pump, a comparator, and a voltage reference generator block. An input signal controls the charge pump which charges and discharges a capacitor connected to an output of the charge pump. The comparator continuously compares the voltage across the capacitor with a reference voltage, ratio of $V_{REF}$, which is generated by the voltage reference generator block. The voltage $V_{REF}$ is generated to compensate for power supply and integration process variations. The voltage reference generator is comprised of a charge pump unit, a frequency divider unit, switches, and two capacitors. The adjusted $V_{REF}$ ratio controls the comparator threshold level and hence a programmable phase difference between the input signal of the charge pump and the output signal of the comparator.

7 Claims, 6 Drawing Sheets

US 7,893,745 B2

WIDEBAND PROGRAMMABLE PHASE SHIFTING CIRCUIT

BACKGROUND OF THE INVENTION

1. Field of the Invention

The present invention relates generally to phase shifting circuitry. More specifically, the present invention relates to a phase shifter that can be adjusted digitally, precisely, and independently of process and supply variations.

2. Description of the Related Art

A phase shifter circuit can find wide applications in instrumentation, measurement, communication, and control systems. The literature shows different types of phase shifters, which include frequency-dependent, frequency-independent, and auto-tuning phase shifters. The frequency-dependent phase shifter circuit provides fixed or variable phase shift at a single frequency. On the other hand, a frequency independent phase shifter provides a fixed phase shift over a wide range of frequency. Auto-tuning phase shifter's main application is related to phase calibration. Automatic phase shifters may be used in a transceiver system to compensate phase mismatching. Vector modulation is one of the common realizations for phase shifters, wherein a variable phase shift may be obtained by adding the outputs of multiphase filters having adjustable amplitudes. However, such a scheme disadvantageously introduces a stringent requirement for a wide range and accurate controllability of the output amplitude of a large number of filters. While numerous other phase shift designs are known, none taken either singly or in combination, are seen to describe the instant invention as claimed.

Thus, a wideband programmable phase shifting circuit solving the aforementioned problems is desired.

SUMMARY OF THE INVENTION

The wideband programmable phase shifting circuit includes a charge pump, a first comparator, and a voltage reference generator block. The input signal controls the charge pump which charges and discharges a capacitor coupled to an output of the charge pump. The comparator continuously compares the voltage across the capacitor with a reference voltage, ratio of $V_{REF}$, which is generated by the voltage reference generator block. The voltage $V_{REF}$ is generated to compensate for the expected power supply and integration process variations.

The voltage reference generator block is comprised of a second charge pump, a frequency divider unit, a plurality of switches, and two capacitors. The adjusted $V_{REF}$ ratio controls the comparator threshold level and hence the phase difference between the input signal of the charge pump and the output signal of the comparator.

A CMOS implementation for the invented phase shifting circuit is presented which provides a wide phase shifting over five decades of frequency, 2 KHz-250 MHz, with a minimal phase error, less than 4.7%.

The phase shift circuit can be implemented as an integrated circuit, and can be operated with a power supply delivering as little as 1.2 volts. The number of different phase shifts generated by the inventive circuitry is limited only by the number of resistors at the comparator input.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
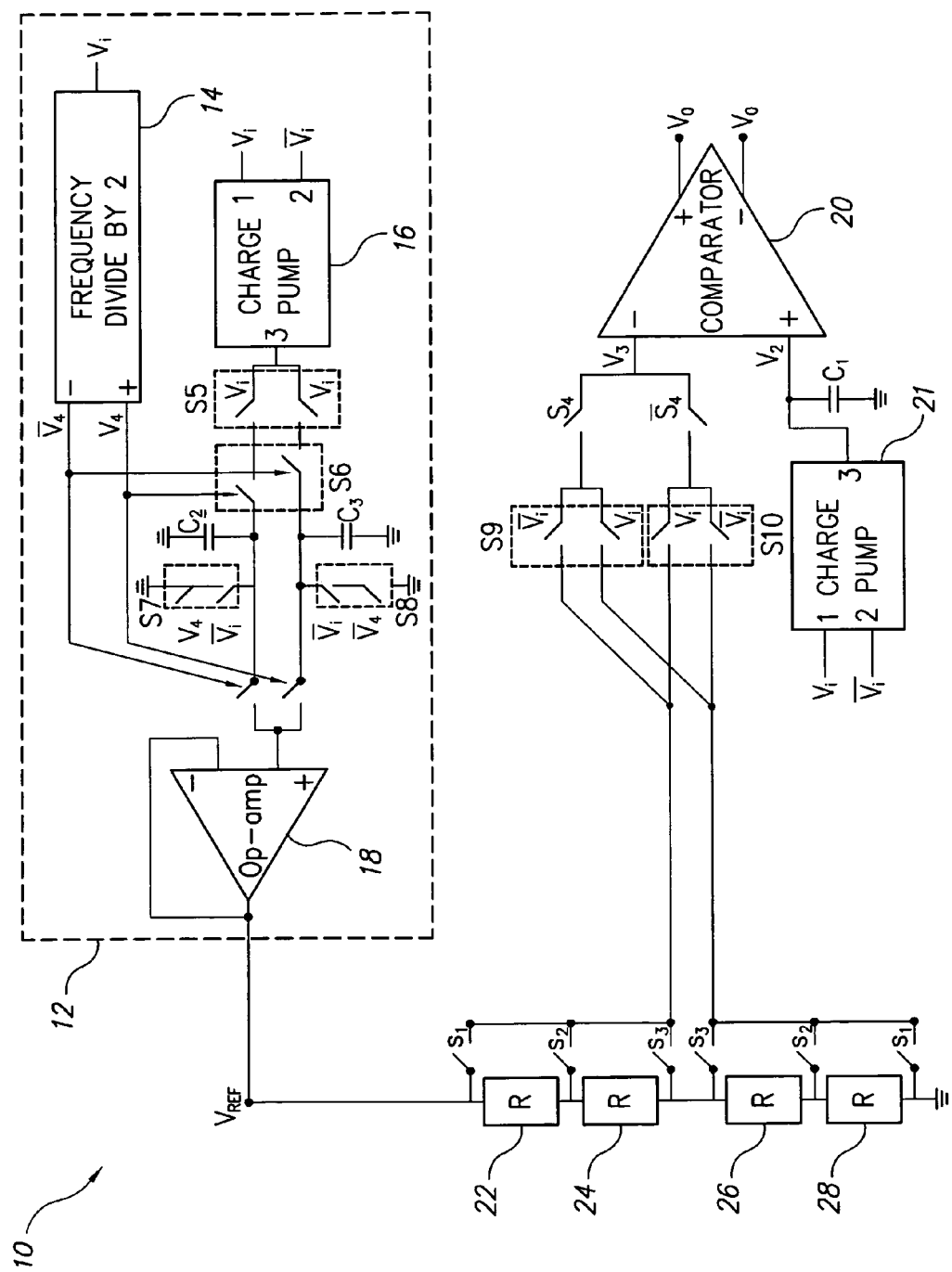
FIG. 1 shows a schematic diagram of a wideband programmable phase shifting circuit according to the present invention.

As shown in FIG. 1, the wideband programmable phase shifting circuitry 10 is comprised of a first charge pump 21, which charges a capacitor $C_1$ as a $V_2$ reference input to a comparator 20. A voltage reference generator block 12 provides a reference voltage $V_{REF}$ as input to a chain of resistors in series comprised of resistances 22, 24, 26, and 28. Input voltage $V_i$ controls charge pump 21, which charges and alternately, discharges capacitor $C_1$, which is coupled to the output of charge pump 21.

The comparator 20 continuously compares the voltage across capacitor $C_1$ with a voltage dependent upon the reference voltage $V_{REF}$, said reference voltage $V_{REF}$ being generated by the voltage reference generator block 12. Charge pump 21 has input pin 1 connected to the input signal $V_i$ and input pin 2 connected to complement input signal $\overline{V}i$ respectively. To demonstrate the operation of the inventive wideband programmable phase shifting circuitry, consider the following scenario. With $V_i$ high (1.2V), output pin 3 of charge pump 21 charges the capacitor $C_1$ with a constant current.

Figure 2:
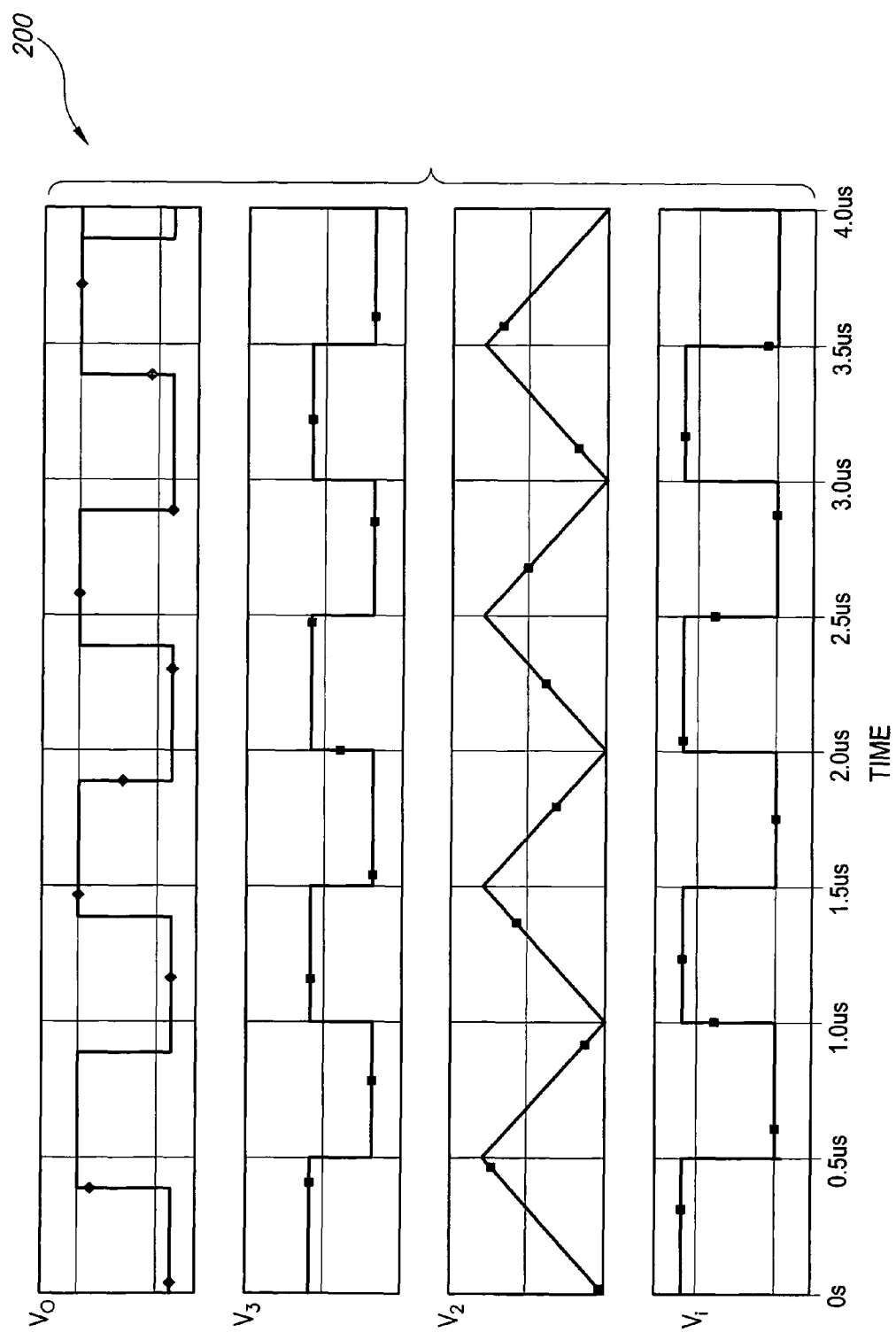
FIG. 2 is a plot showing the waveforms at different nodes produced by a wideband programmable phase shifting circuit according to the present invention.

As shown in plot 200 of FIG. 2, the voltage $V_i$ provided at input pin 1 of charge pump 21 is a square wave voltage which swings between a nominal low value and a nominal high value. The charging that occurs at capacitor $C_1$ is repeated every high half cycle, i.e., when $V_i$ is high. In the other half cycle, low $V_i$, charge pump unit 1 draws a constant current $I_1$ from the capacitor $C_1$, so that both halves combine to form an integration of the square wave input $V_i$, hence a triangular waveform signal $V_2$ (as shown in FIG. 2) is generated across capacitor $C_1$.

The comparator 21 compares signals $V_2$ and $V_3$ and provides high output signal, $V_o$, if $V_2$ exceeds $V_3$ and low $V_o$ if $V_2$ is smaller than $V_3$. As a result, the comparator 21 generates an output signal $V_o$ having substantially the same waveform of input signal $V_i$ but at a predetermined phase φ difference from the input signal $V_i$. The switches $S_1$-$S_4$ are used to adjust the voltage level $V_3$, thereby controlling the phase shift φ of output signal voltage $V_o$ from input signal voltage $V_i$. The comparator 21 also provides the complement of $V_o$ at its minus output terminal.

To illustrate the process in further detail, the voltage waveforms at different nodes of FIG. 1 are presented in FIG. 2. Consider the case when switch $S_2$ and $S_4$ are on, hence $V_3$ will be set to ¾ of the reference voltage $V_{REF}$ when the input signal $V_i$ is high and will be set to ¼ $V_{REF}$ when $V_i$ is low. Thus the phase shift φ can be described by equation (1).

$$\phi = \frac{180° C_1 k V_{REF}}{\frac{TI_1}{2}} \quad (1)$$

where k is the reference voltage ratio.

The voltage $V_{REF}$ is generated using the reference voltage generator 12. The voltage $V_{REF}$ is generated to compensate for expected power supply and integration process fluctuations. The voltage reference generator is comprised of a second charge pump 16 connected via switch blocks $S_5$ and $S_6$, to capacitors $C_2$ and $C_3$. A frequency divider 14 has its outputs $V_4$ and $\overline{V}_4$ connected to the same switch blocks $S_5$ and $S_6$. Switch blocks $S_5$ and $S_6$ control the amount of charge that can be pumped into capacitors $C_2$ and $C_3$ and thus the magnitude of the voltage $V_{REF}$. Switch blocks $S_7$ and $S_8$ control the discharging process of the voltages of capacitors $C_2$ and $C_3$, and thus the voltage $V_{REF}$ values will be frequent updated. The operational amplifier 18 has a unity gain configuration which is inserted as a buffer to provide the capacitors $C_2$ and $C_3$ voltages with good driving capability.

Figure 3:
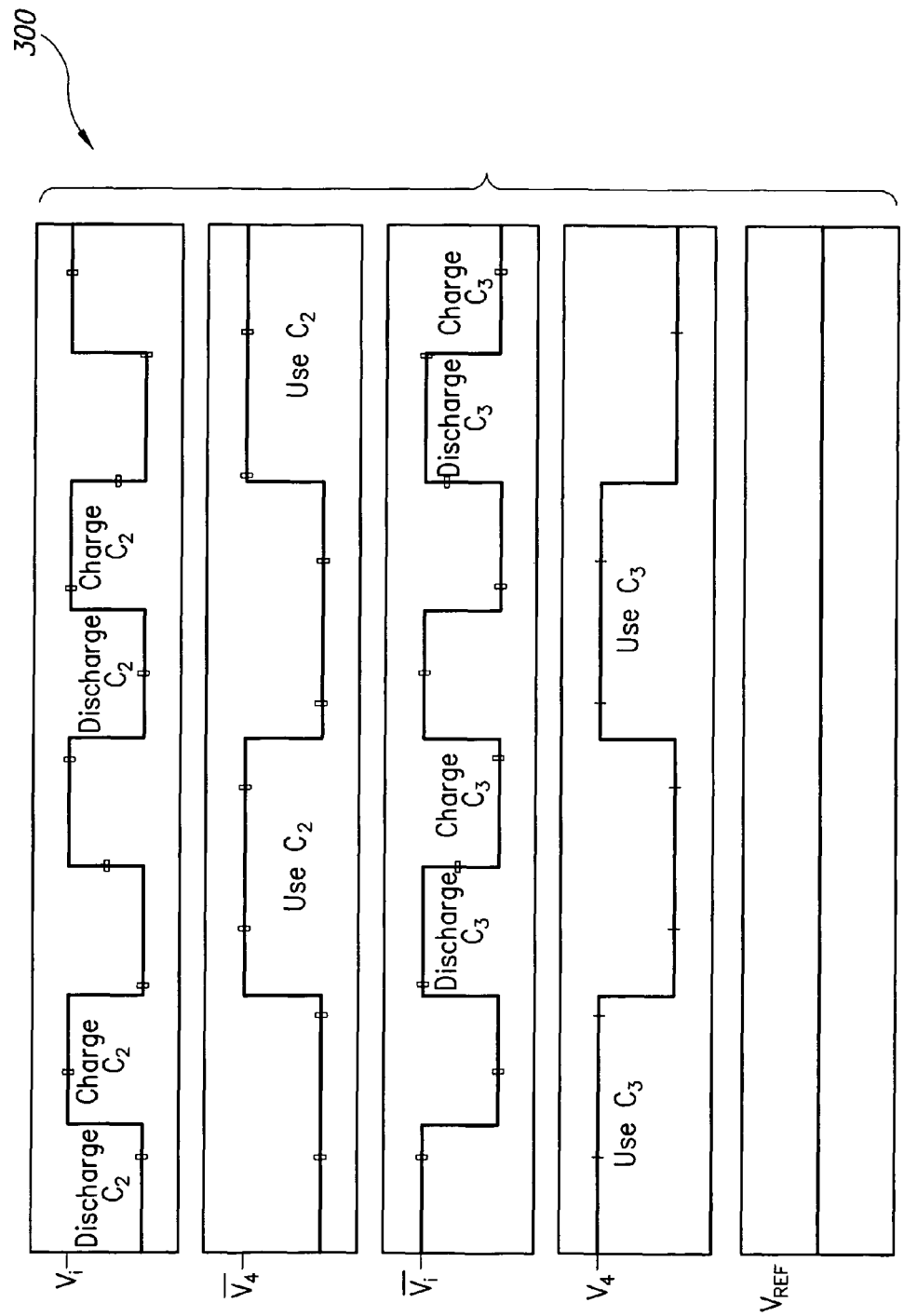
FIG. 3 is a plot showing the waveforms at different nodes of the $V_{REF}$ generator circuit of a wideband programmable phase shifting circuit according to the present invention.

The voltage waveforms shown in plot 300 of FIG. 3 depict the charging, discharging, and utilization period of the voltages across $C_2$ and $C_3$. $V_{REF}$ can be obtained by equation (2).

$$V_{REF} = \frac{I_1 T}{2C}, \text{ where } C_2 = C_3 = C \quad (2)$$

From equations (1) and (2), and with $C_1 = C$, the phase shift $\phi$ can be given by:

$$\phi = 180° k \quad (3)$$

As depicted from equation (3), the phase shift $\phi$ is independent of process and supply variations. Moreover, the phase shift value can be selected precisely through a digital word of four bits $b_1$-$b_4$, which controls the switches $S_1$-$S_4$. The chain of equal resistors 22, 24, 26, and 28 in conjunction with the switches $S_1$-$S_4$ is used to provide four different voltage levels for $V_3$. Consequently seven different phase shifts values, (−45°, −90°, −135°, 45°, 90°, 135°, and 180°), are obtained. More values of phase shift, i.e., a finer resolution, can be obtained by including more resistors in the chain.

Although the phase shifting circuitry of FIG. 1 can be implemented in different technology processes, it has been implemented here as an example in a 0.18 µm CMOS technology to prove functionality and performance of the inventive wideband programmable phase shifting circuitry. The obtained result shows a good agreement between the theoretical and simulated results over wide ranges of phase shift and frequency.

Figure 4:
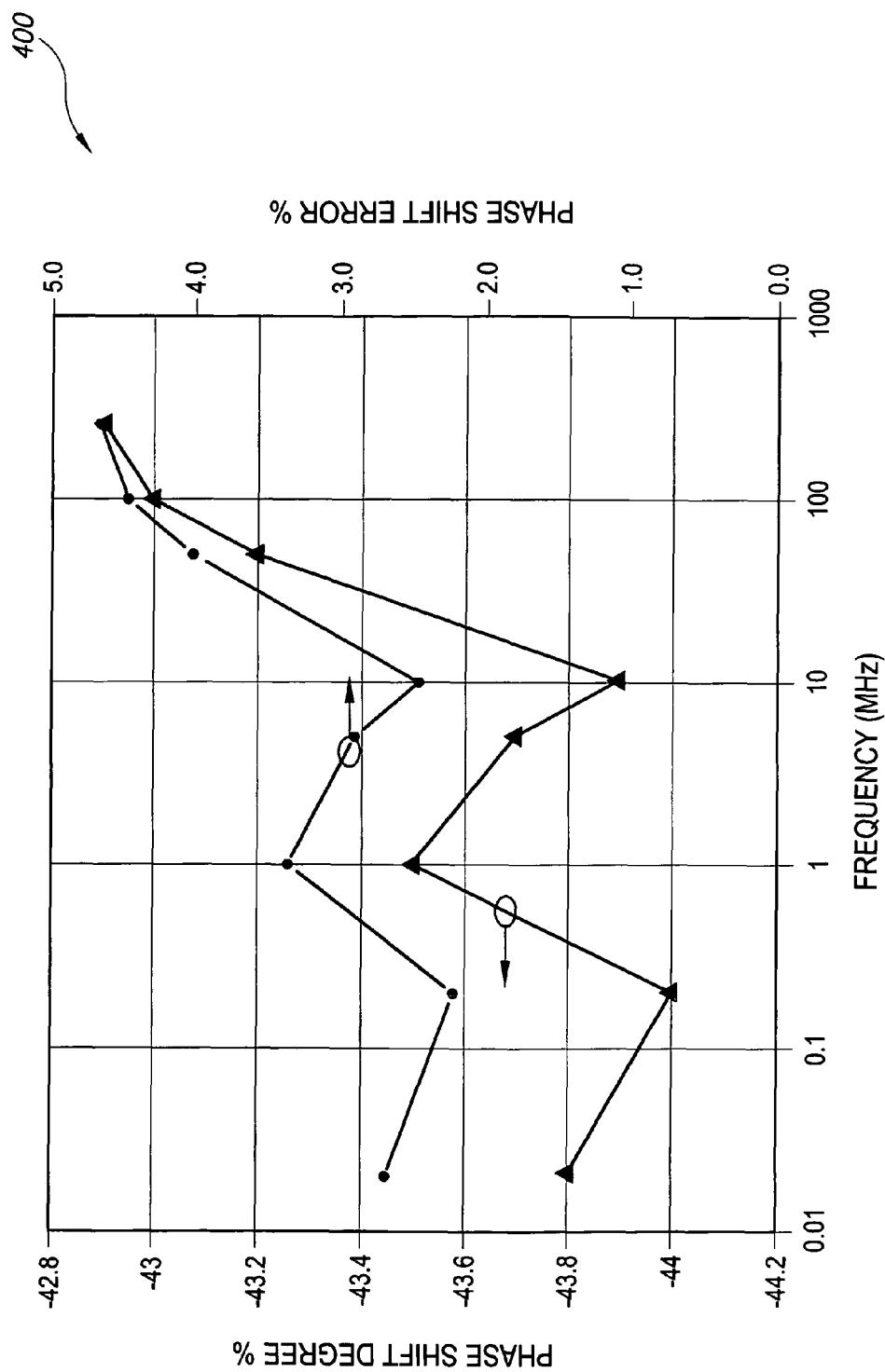
FIG. 4 is a chart showing the performance of the CMOS phase shift circuit over a wide band of frequencies in a wideband programmable phase shifting circuit according to the present invention.
Figure 5:
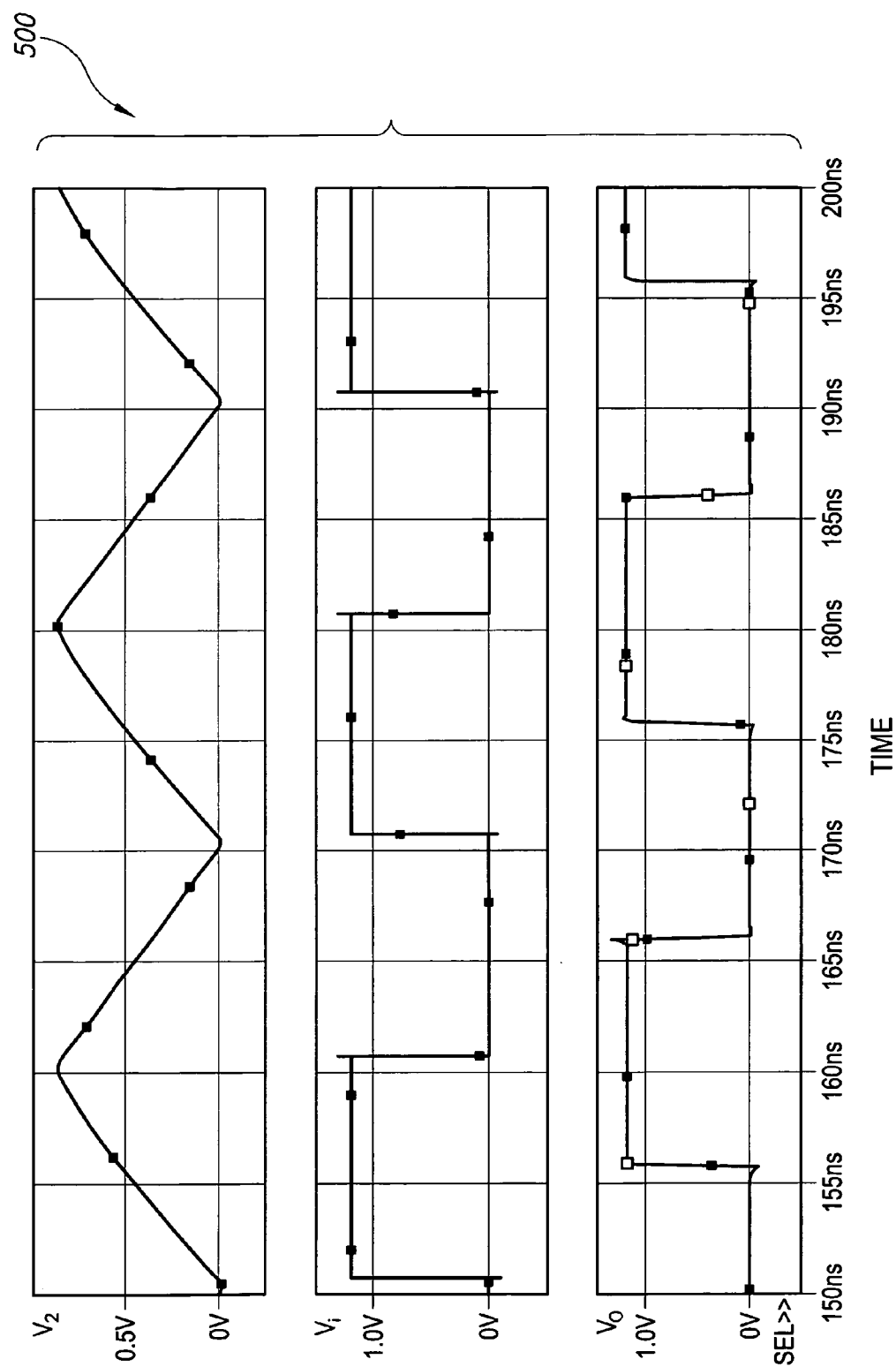
FIG. 5 are plots showing the voltage waveforms of the CMOS phase shift circuit when adjusted to provide a 45° phase shift in a wideband programmable phase shifting circuit according to the present invention.

The phase shift error plot 400 shown in FIG. 4 reveals that an error less than 4.7% is obtained over the frequency band of 2 KHz-250 MHz. Plot 500 of FIG. 5 shows the waveforms of $V_2$, $V_i$, and $V_o$ at input frequency of 50 MHz and a phase shift of 90°.

Figure 6:
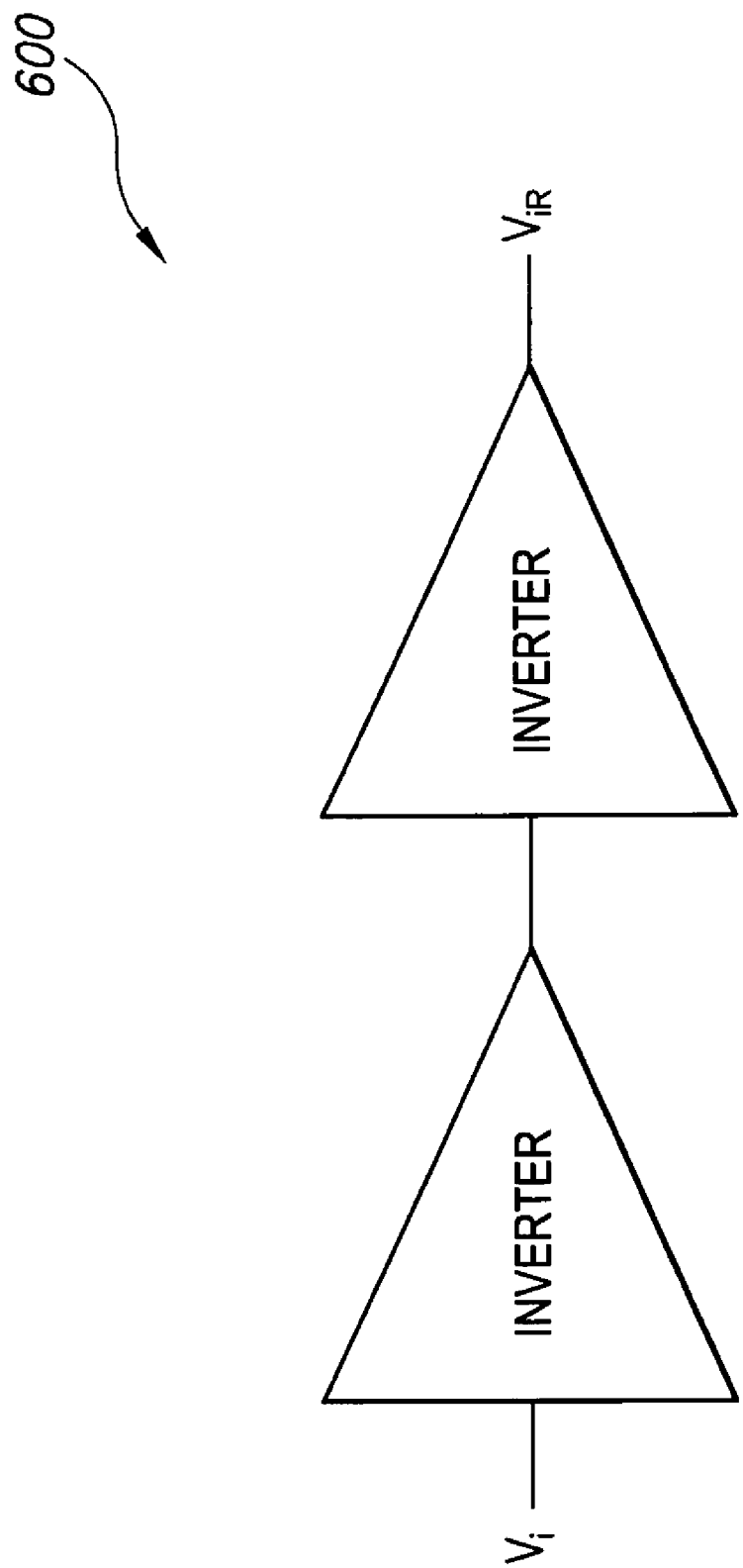
FIG. 6 is a partial schematic diagram showing two inverters in cascade to generate a new reference input signal in a wideband programmable phase shifting circuit according to the present invention.

In the embodiment shown, the comparator delay is found to be 45 ps, which is a negligible amount of delay for a frequency operation lower than 50 MHz. However, the comparator delay of 45 ps represents a major source for phase shift error in the higher operating frequency range. As shown in FIG. 6, a cascade 600 comprising two CMOS inverters can be used to generate a new reference input signal which is compared with the output signal of the phase shifting circuit, thereby overcoming the comparator delay problem.

In summary, the adjusted $V_{REF}$ ratio controls the comparator threshold level and hence the phase shift difference between the input signal of the charge pump and the output signal of the comparator. A CMOS implementation for the invented phase shifting circuit is presented which provides a wide phase shifting over five decades of frequency, 2 KHz-250 MHz, with a minimal phase error, less than 4.7%.

It is to be understood that the present invention is not limited to the embodiment described above, but encompasses any and all embodiments within the scope of the following claims.

I claim:

1. A wideband programmable phase shifting circuit, comprising:
    a divide-by-two frequency divider having an input accepting a periodic input signal voltage and having an output that generates a signal having twice the period of the periodic input signal voltage;
    an amplifier having at least one input connected to the output of the frequency divider, the amplifier generating a reference voltage output;
    a reference voltage generator charge pump having inputs accepting the periodic input signal voltage and a complement of the periodic input signal voltage, an output of the reference voltage generator charge pump being connected to the at least one input of said amplifier;
    a comparator having a first input, a second input, and at least one output;
    a switched voltage divider network connected to the reference voltage output of the amplifier, the switched voltage divider network having an output generating a percentage of the reference voltage, the reference voltage percentage being determined by a switch configuration of the switched voltage divider network, the switched voltage divider network output being connected to the first input of the comparator; and
    a comparator charge pump having inputs accepting the periodic input signal voltage and a complement of the periodic input signal voltage, an output of the comparator charge pump being connected to the second input of the comparator;
    wherein the at least one output of the comparator generates a periodic output signal voltage having a phase shift with respect to the periodic input signal voltage, a value of the phase shift being determined by the reference voltage percentage applied to the first input of the comparator.

2. The wideband programmable phase shifting circuit according to claim 1, wherein the amplifier is an operational amplifier.

3. The wideband programmable phase shifting circuit according to claim 2, wherein the operational amplifier is configured for unity gain closed loop operation.

4. The wideband programmable phase shifting circuit according to claim 1, further comprising means for precisely setting the phase shift of the output signal with respect to the input signal.

5. The wideband programmable phase shifting circuit according to claim 4, further comprising means for providing an arbitrarily large number of phase shift settings of the output signal.

6. The wideband programmable phase shifting circuit according to claim 1, wherein the phase shift circuit is implemented in an integrated circuit having properties optimized for low power consumption.

7. The wideband programmable phase shifting circuit according to claim 1, wherein the phase shift circuit is implemented in an integrated circuit having properties optimized for high speed operation.

* * * * *